United States Patent
Sawhney

(10) Patent No.: US 6,865,131 B2
(45) Date of Patent: *Mar. 8, 2005

(54) MEMORY DEVICES WITH REDUCED POWER CONSUMPTION REFRESH CYCLES

(75) Inventor: Ramandeep S. Sawhney, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/441,702

(22) Filed: May 20, 2003

(65) Prior Publication Data

US 2003/0206464 A1 Nov. 6, 2003

Related U.S. Application Data

(63) Continuation of application No. 09/808,900, filed on Mar. 15, 2001, now Pat. No. 6,567,332.

(51) Int. Cl.[7] ................................................ G11C 7/00
(52) U.S. Cl. ...................... 365/222; 365/190; 365/149; 365/230.03
(58) Field of Search ............................. 365/222, 149, 365/190, 230.06, 230.03, 230.08, 185.5, 185.25, 230.09

(56) References Cited

U.S. PATENT DOCUMENTS

| | | | |
|---|---|---|---|
| 4,631,701 A | 12/1986 | Kappeler et al. | 364/900 |
| 5,229,970 A | 7/1993 | Lee et al. | 365/222 |
| 5,262,998 A | 11/1993 | Mnich et al. | 365/222 |
| 5,276,843 A | 1/1994 | Tillinghast et al. | 395/425 |
| 5,278,796 A | 1/1994 | Tillinghast et al. | 365/211 |
| 5,323,350 A | 6/1994 | McLaury | 365/208 |
| 5,335,201 A | 8/1994 | Walther et al. | 365/222 |
| 5,392,251 A | 2/1995 | Manning | 365/222 |
| 5,539,703 A | 7/1996 | Manning | 365/222 |
| 5,598,376 A | 1/1997 | Merritt et al. | 365/230.06 |
| 5,684,751 A | 11/1997 | Manning | 365/222 |
| 5,717,654 A | 2/1998 | Manning | 365/233.5 |
| 5,822,264 A * | 10/1998 | Tomishima et al. | 365/222 |
| 5,835,433 A | 11/1998 | Casper | 365/207 |
| 5,844,849 A * | 12/1998 | Furutani | 365/194 |
| 5,903,507 A | 5/1999 | Arimoto | 365/222 |
| 5,959,924 A * | 9/1999 | Son et al. | 365/222 |
| 5,999,471 A | 12/1999 | Choi | 365/222 |
| 6,094,705 A | 7/2000 | Song | 711/106 |
| 6,097,658 A | 8/2000 | Satoh et al. | 365/222 |
| 6,208,577 B1 | 3/2001 | Mullarkey | 365/222 |
| 6,304,494 B1 | 10/2001 | Arimoto | 365/189.09 |
| 6,507,532 B1 * | 1/2003 | Fujino et al. | 365/230.03 |
| 6,567,332 B2 * | 5/2003 | Sawhney | 365/222 |
| 6,608,772 B2 * | 8/2003 | Ooishi | 365/63 |

* cited by examiner

*Primary Examiner*—Connie C. Yoha
(74) *Attorney, Agent, or Firm*—Schwegman, Lundberg, Woessner & Kluth, P.A.

(57) ABSTRACT

Systems, devices, structures, and methods are described that reduce energy consumption during a refresh cycle in a memory device. An isolation signal is held in a non-energized state until the it is determined that another action is to be performed on the section of memory associated with the isolation signal. The isolation accordingly cycles from an energized state to a non-energized state and back for each complete refresh cycle in the section of memory.

32 Claims, 7 Drawing Sheets

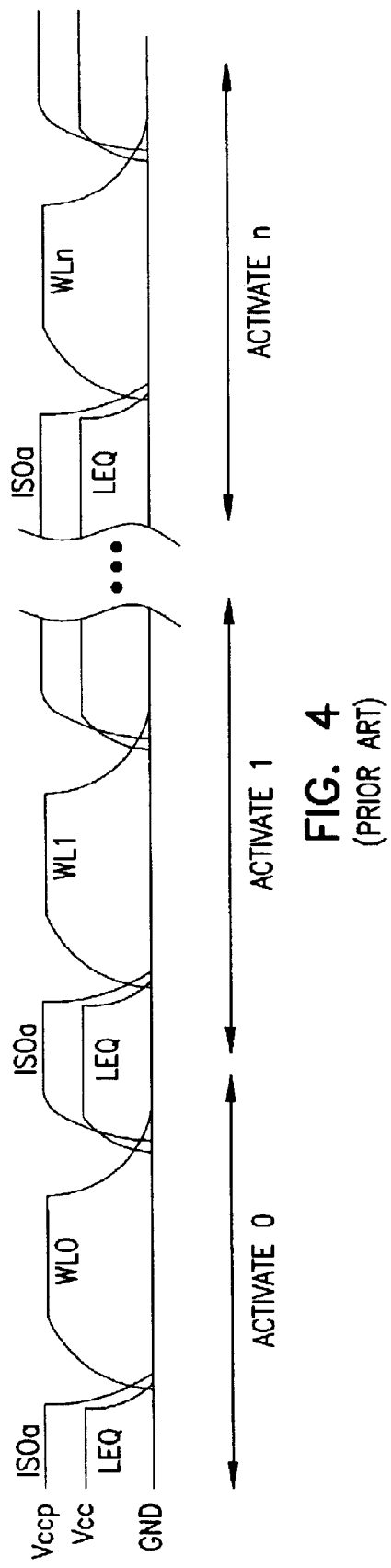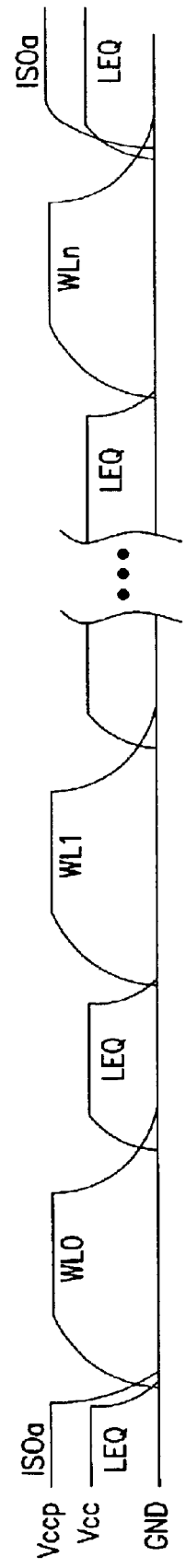
FIG. 4 (PRIOR ART)
FIG. 5

MEMORY DEVICES WITH REDUCED POWER CONSUMPTION REFRESH CYCLES

RELATED APPLICATIONS

This application is a Continuation of U.S. application Ser. No. 09/808,900 filed on Mar. 15, 2001, now U.S. Pat. No. 6,567,332 which is incorporated herein by reference.

FIELD OF THE INVENTION

The technical field relates generally to memory devices, and, more particularly, to memory devices having reduced power consumption refresh cycles.

BACKGROUND

Memory cells are commonly formed in integrated circuits by energy storage devices, such as capacitors. A capacitor is composed of two layers of a material that is electrically conductive (hereinafter, electrodes) brought near to one another and separated by a material that is electrically nonconductive. The capacitor is connected to an energy source (e.g. battery) with a certain voltage level (hereinafter, energy level). Charge flows from the energy source to the capacitor until the capacitor exhibits the energy level of the energy source. Then, the capacitor is disconnected from the energy source. The capacitor will exhibit the energy level of the energy source until the charges stored in the capacitor are removed either by design or unintentionally.

This ability of the capacitor to "remember" an energy level is valuable to the operation of semiconductor integrated circuits. Often, the operation of such circuits may require that data be stored and retrieved as desired. Because of its ability to remember, the capacitor is a major component of a semiconductor memory cell. One memory cell typically stores one bit of data. A system of memory cells is a semiconductor memory array where information can be randomly stored and retrieved from each memory cell. Such a system is also known as a random-access memory.

One type of random-access memory is dynamic random-access memory (DRAM). The charges stored in DRAM tend to unintentionally leak away over a short time. It is thus necessary to periodically refresh the charges stored in the DRAM. Even with the refresh burden, DRAM is a popular type of memory because it can occupy a very small space on a semiconductor surface. This is desirable because of the need to maximize storage capacity, i.e. the number of stored bits, on the limited surface area of an integrated circuit.

Examples of some refresh schemes are disclosed in U.S. Pat. No. 6,097,658 issued to Satoh et al.; U.S. Pat. No. 6,094,705 issued to Song; and U.S. Pat. No. 4,631,701 issued to Kappeler et al.; all incorporated herein by reference.

Many modern electronic devices are portable devices which use a battery as its energy source. As more and more portable electronic devices are developed and find commercial acceptance, it is desirable to conserve energy. Conservation of energy is driven by the need to use smaller and lighter power supplies so the electronic devices incorporating the power supply are themselves smaller and lighter. Moreover, there is a need to conserve energy so that the energy source lasts longer and the electronic device can operate longer between energy source charges or replacement. Accordingly, power consumption in memory devices used in electronic devices is becoming increasingly important.

SUMMARY

The above-mentioned problems with memory devices as well as other problems are addressed by the present invention and will be understood by reading and studying the following specification including the drawings attached hereto. Systems, devices, structures, and methods are described which provide benefits over conventional memory devices.

An illustrative embodiment includes a method for refreshing memory cells in a memory device, wherein the refresh operation uses less energy than conventional refresh operations.

Another illustrative embodiment includes a method of conserving energy while refreshing memory cells in a memory device. One embodiment of the invention includes holding the isolation signal in a non-energized state while refreshing memory cells in an adjacent section of the memory device. The isolation signal is held in the non-energized state under a certain conditions, including but not limited to, completion of the refresh cycle, receipt of a memory address in the memory section, and receipt of a redundancy signal.

Another illustrative embodiment includes a method of reducing energy consumption during a refresh operation in a memory device. The method includes shifting an LEQ signal from an energized state to a non-energized state. The method further includes shifting an isolation signal from an energized state to a non-energized state The method further includes sequentially energizing wordlines in the memory device to refresh the memory cells connected to the energized wordline, and holding the isolation signal in a non-energized state during energizing at least two wordlines.

Another illustrative embodiment includes a memory array, which must be refreshed to preserve the integrity of the data stored therein. The memory array includes at least one memory section having a plurality of wordlines each connected to at least one memory cell. The memory cells are further connected to digit lines which are connected to a sense amplifier through isolation gates. An isolation gate control circuit holds the isolation gate off during a refresh cycle of the memory section until an end event occurs. An end event is an event in the memory array that indicates the refresh operation is to end. In various embodiments, the end event includes, but is not limited to, at least one of completion of a self refresh cycle, addressing a memory cell in the memory section for a read or write operation, a redundancy operation, or issuance of an end refresh signal by a control circuit.

Another illustrative embodiment includes a controller for a refresh operation in a memory device. The controller holds the isolation signal at a non-energized state until an end refresh event occurs.

Other illustrative embodiments include a DRAM, a circuit module, a memory module, an electronic system, a memory system, or a computer system, which include the memory refresh structure according to the present invention or performs a memory refresh according to method of the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

BRIEF DESCRIPTION OF THE DRAWINGS

FIG. 4 is a timing diagram of a conventional memory refresh operation.

FIG. 5 is a timing diagram of a memory refresh operation of a memory device according to one embodiment of the present invention.

DETAILED DESCRIPTION

In the following detailed description of various embodiments of the present invention, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined by the appended claims and their equivalents.

Figure 1:
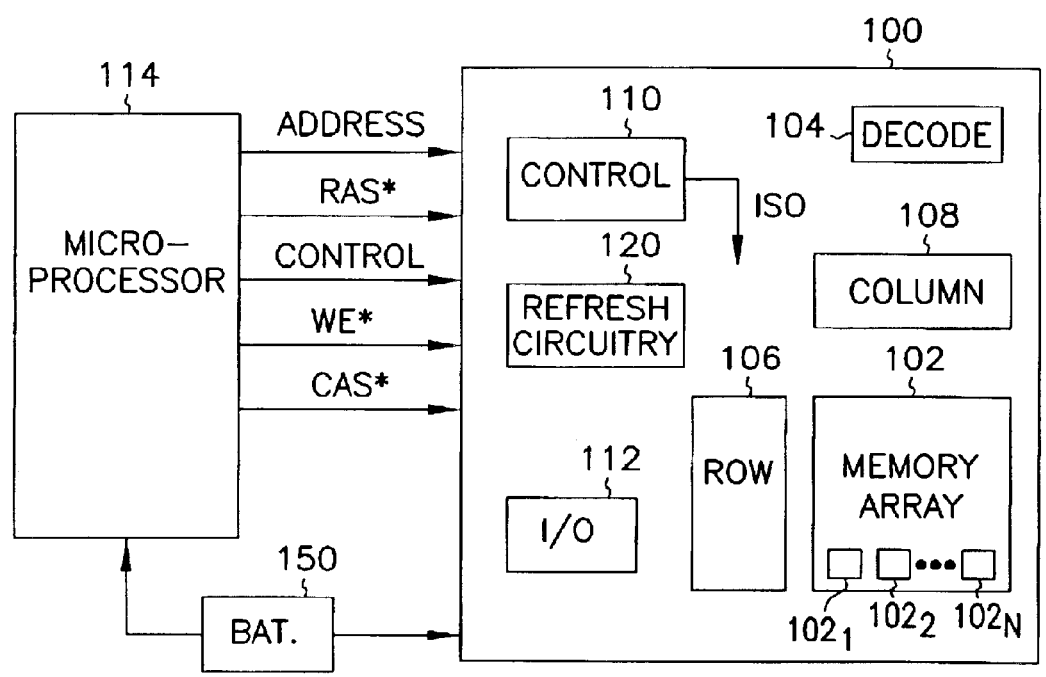
FIG. 1 is a block diagram of a device having a memory array.

FIG. 1 is a simplified block diagram of a memory device according to one embodiment of the invention. A memory device 100, e.g. DRAM, includes an array of memory cells 102, address decoder 104, row decoder 106, column decoder 108, control circuitry 110, and Input/Output circuit 112. The memory device can be coupled to an external microprocessor 114, or memory controller for memory accessing functions, or other external circuitry. Memory device 100 receives control signals from the processor 114, such as WE*, RAS*, and CAS* signals. The control circuitry 110 produces an ISO signal as understood by those of skill in the art. In one embodiment, ISO signal in an energized ("on") state is powered to 1.5 times Vcc, which is typically expressed as Vccp. The memory device 100 and processor 114 are both powered by an energy source, and in the case of portable electronic devices, the energy source is a battery 150. The battery may be of a rechargeable type (e.g. Li Ion, alkaline) or non-rechargeable type. The memory device is used to store data which is accessed via I/O lines. Memory device 100 has at least one memory array 102, and may include a plurality of arrays to increase the memory storage capacity. Memory array 102 may be divided into a plurality of sub-arrays or sections $102_1$, $102_2$ . . . $102_N$. A refresh circuit 120 is provided to refresh the charge in the individual cells (e.g. capacitors or transistors) which form the memory array 102. In the case of DRAMs, the charge in the cell dissipates in a matter of milliseconds. Hence, the data bit stored in each of the memory cells must be re-read and recharged many times per second in order to hold its data.

The process used to restore the charge in DRAM memory cells at specified intervals is generally referred to as a refresh operation. The required refresh interval is a function of the memory cell design and the semiconductor technology used to manufacture the memory device. There are several conventional refresh schemes that may be used. A conventional scheme is shown in FIG. 4. A scheme according to the present invention is shown in FIG. 5. Both of these schemes are discussed below.

Figure 2:
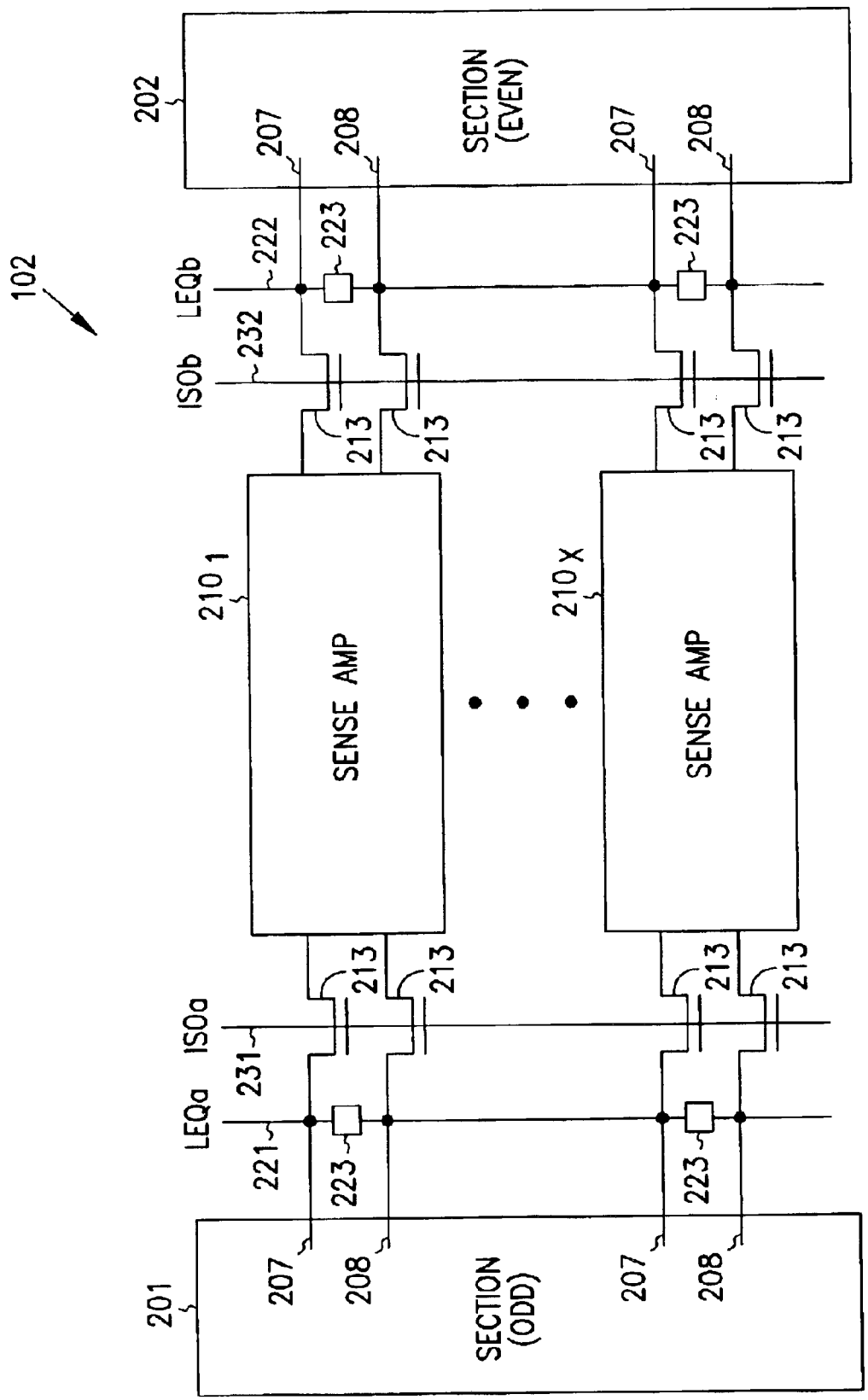
FIG. 2 is a block diagram of a memory system according to one embodiment of the present invention.

FIG. 2 schematically shows a memory array 102, which includes a first memory section (sub-array) 201 and a second memory section (sub-array) 202, according to the present invention. The first and second sub-arrays 201 and 202 are respectively labeled as an odd section and an even section in FIG. 2. Each memory section includes numerous memory cells (not shown) which store a charge representing one data bit. Each cell is addressable by column and wordline as the same is known and understood by one of ordinary skill in the art. The memory sections 201, 202 each include a plurality of wordlines, for example, 128, 256, 512, or more addressable wordlines. The size of the memory, i.e. the number of wordlines, depends on the architecture of the memory array 102 and memory device 100. It is usually desired to have a greater number of wordlines in each section which results in a large memory capacity in each memory array. As shown in FIG. 2, a number of pairs of digit lines 207, 208 (DIG and DIG*) are connected to respective memory cells in each of the memory sections 201 and 202. The pairs of digit lines 207, 208 from each of the memory sections 201 and 202 are connected to one or more sense amplifiers $210_1$–$210_X$, where X is the number of sense amplifiers. It will be recognized by those of skill in the art that the sense amplifiers $210_1$–$210_X$ operate to determine the change in charge on the digit lines 207, 208 and fully drive the digit lines to the charge stored in the memory cells selectively connected thereto. A brief description of the sense amplifier operation is described in U.S. Pat. No. 5,835,433 issued to Casper, assigned to the assignee of the present application, and incorporated herein by reference.

FIG. 2 further shows a pair of equilibration lines 221 and 222. Equilibration line 221 is connected to equilibration circuits 223, which are connected to pairs of digit lines 207, 208 connected to memory section 201. Equilibration line 222 is connected to equilibration circuits 223, which are connected to pairs of digit lines 207, 208 connected to memory section 202. Equilibration lines 221, 222 are respectively connected to equilibration drivers (not shown) that are controlled by control 110. Equilibration drivers produce LEQ signals in response to control signals from control 110. In another embodiment, equilibration lines 221, 222 are connected to a single driver (not shown) that generates at least one equilibration signal. That is, the equilibration lines 221, 222 may carry a same signal. The number of equilibration circuits 223 is equal to half the number of digit lines 207, 208. Equilibration circuits 223, when activated by a driver, are used to equilibrate the voltage of digit lines 207, 208 between read and write operations. Typically, the voltages on the digit lines are equilibrated to Vcc/2. The operation of the equilibration circuits 223 is known and understood by one of ordinary skill in the art. As shown in FIG. 2, LEQa signal is connected with the digit lines connected to the odd memory section 201 and is communicated through line 221. LEQb signal is connected with digit lines connected to the even memory section 202 and is communicated through line 222.

Each digit line 207 and 208 includes an isolation switch (sometimes referred to as a "gate") 213, which is shown as a transistor (MOSFET) having the gate thereof connected to an isolation signal line 231, 232. Isolation signal line 231 is associated with the odd memory section 201 and carries the ISOa signal. When the ISOa signal goes low, switches 213 electrically isolate odd memory section 201 from the sense amplifiers 210. Isolation signal line 232 is associated with the even memory section 202 and carries the ISOb signal. When the ISOb signal goes low, switches 213 electrically isolate even memory section 202 from the sense amplifiers 210.

Figure 3:
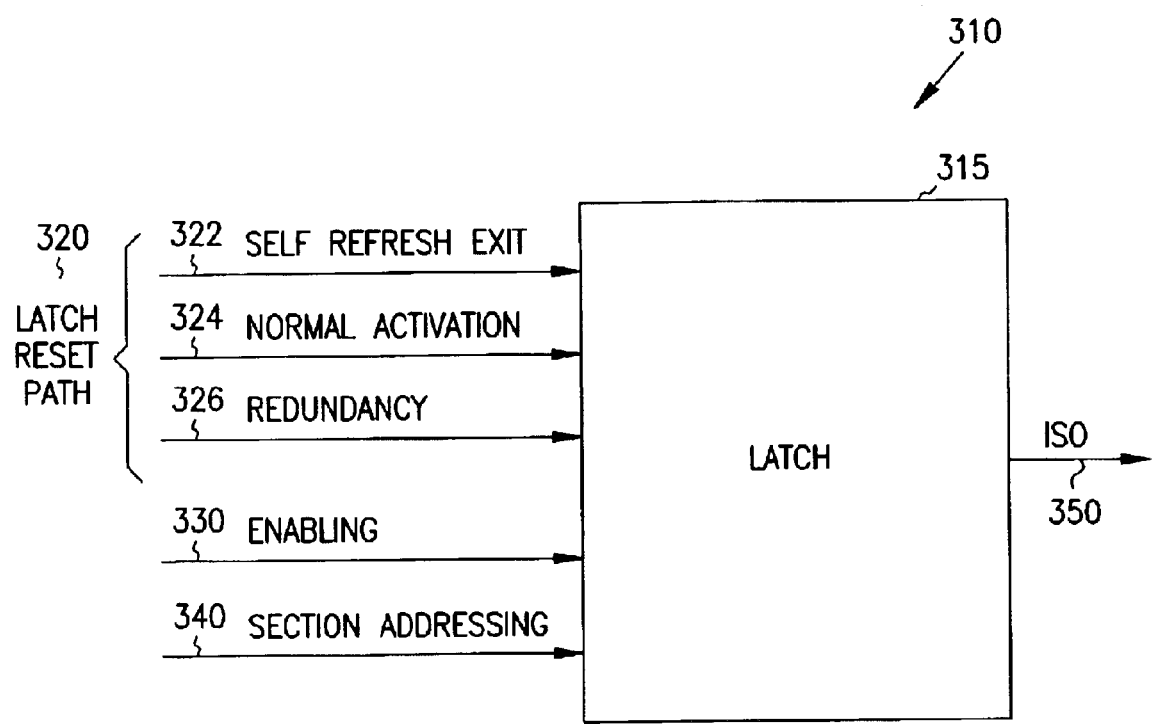
FIG. 3 is a diagram of an isolation signal generation circuit according to one embodiment of the present invention.

FIG. 3 illustrates an ISO control circuit 310 according to the teachings of the present invention. Circuit 310 includes a latch 315, which receives a plurality of inputs 320, 330, or 340 and creates as an output 350 the ISO signal. One ISO control circuit 310 is connected to each of the ISO signal lines 231, 232 in the memory array 102 for producing ISOa, ISOb signals, respectively. ISO control circuit 310 may be incorporated into an ISO signal driver as the same will be known and understood by one of ordinary skill in the art. While two ISO signals and signal lines are shown and described, it will be understood that other numbers of ISO signals and lines may also be used.

Latch 315 receives inputs signals through a number of input lines, shown in FIG. 3 as a latch reset path signal 320, an enable signal 330, and an address signal 340, which are generated by control circuits (not shown). The latch reset path signal 320 is an "off" (e.g. high or low depending on circuit layout) signal until an operation is to be performed on the memory section connected to the same ISO signal line as circuit 310. For example, the latch reset path signal 320 shifts to "on" (high) when a refresh cycle is stopped in the associated memory section. Upon receiving an "on" latch rest signal, latch 315 shifts the ISO signal high and activates gates 213 to connect digit lines 207, 208 to sense amplifiers 210. The ISO signal returns to conventional operation associated with non-refresh functions of the memory section.

In one embodiment, reset path signal 320 includes a self refresh exit signal 322, a normal activation signal 324, and a redundancy signal 326. Each of signals 322, 324, and 326 represent a signal for ending holding the ISO signal in its un-energized or low energy state. Signals 322 and 324 represent one type of end refresh event. Self refresh exit signal 322 represents the completion of a self-refresh operation, e.g. all memory cells have been refreshed, user issues an exit command or any other basis for ending a self refresh operation for the memory section associated with the output ISO signal from the circuit 310. Normal activation signal 324 represents activating the memory section for a read or write operation. Redundancy signal 326 represents a jump in the sequential addressing in a memory section to another memory section for any reason. That is, the refresh operation of this memory section ends due to the sequential memory address progressing to another section.

The enable signal 330 is "off" for a refresh cycle. The enable signal 330 being in an "on" state is another end refresh event. The "on" enable signal 330 indicates, in one embodiment, that control circuits (not shown) have turned this memory array 102 "on" for a write or read operation. One example of enable signal 330 is WE*. Another example of an enable signal 330 is a signal produced by address transient detector, which detects a change in an address signal in the memory device as understood by one of ordinary skill in the art.

The section address signal 340 is "on" for a refresh cycle. The section address signal 340 being in the "off" state is a end refresh event for the particular memory section. The "on" address signal indicates, in one embodiment, that a section address for controlling access in a memory section has been generated by addressing circuitry (e.g. processor 114 or memory controller) and appropriate addresses are sent to respective decode circuits, e.g. decoder 104, row decoder 106, column decoder 108. Thus, the section address signal 340 is "off" when no section address signal is generated for an address of a memory cell in a particular section, such as during a refresh cycle.

Accordingly, the latch produces a low output ISO signal, when the latch reset path signal 320 is "off" and the enable signal 330 is "off". The address signal 340 is "on". The low ISO signal communicates through the ISO signal line, e.g. lines 231 or 232, to control operation of isolation gates 213. Latch 315 holds the state of the output ISO signal until one of the rest path signal 320, the enable signal 330 or the address signal 340 shift to the "off" state. Once a refresh operation begins circuit 310 holds the ISO signal an unpowered or low energy ("off") state. This state is maintained until an end refresh event occurs and a signal 320, 330, or 340 is input into circuit 310. Once this happens, the ISO signal is re-energized and returns to normal operation involved in isolating and connecting memory sections to the sense amplifiers through digit lines. This saves power by not re-energizing the ISO signal on line 231 or 232 and the associated isolation gates 213 during a refresh operation. Once in a refresh operation, the memory device 102 assumes it stays in a refresh mode for a particular section until an end refresh event occurs.

In another embodiment of the present invention, the enable signal 330 is used to control activation of the refresh control circuit 310. The refresh control circuit has a inactive state and an active state. In the inactive state, the refresh control circuit 310 is disabled and the associated memory section is not in a refresh operation. The ISO signal operates is a conventional manner to allow access to the data stored in the memory section. In the active state of the refresh control circuit 310, the associated memory section is undergoing a refresh operation. Refresh control circuit 310 is enabled to hold the ISO signal in a de-energized state until an end refresh event occurs.

Some memory devices must be refreshed in order to preserve the integrity of the stored data. In the case of DRAM, the refresh must occur several times each second. FIG. 4 illustrates a timing diagram of a conventional refresh operation for refreshing memory cells in a memory array. The LEQ signal shifts "low" (unpowered or grounded) to turn off the equilibration circuits. This electrically disconnects the pair of digit lines from the equilibration circuit connected therebetween. Accordingly, the equilibration circuits will not interfere with refreshing the memory cells. At about the same time as the LEQ signal shifts "low", the isolation signal is also shifted "low" (unpowered or grounded) in order to electrically disconnect (open) the sense amplifiers from the memory section. Then the first of the wordlines $WL_0$ is energized to refresh the memory cells connected thereto as the same will be understood by one of ordinary skill in the art. After a certain length of time, depending on the refresh requirements of the memory cells connected to the wordline and the clock signal, the wordline is de-energized (grounded) and both the LEQ and ISO signals are energized. This process repeats n times, once for each of n wordlines, $WL_0$ to $WL_{n-1}$, in the memory section. In a conventional refresh operation, the ISO signal is re-energized n times during a refresh operation in a memory array having n wordlines.

For further illustration of the energy consumption during a conventional refresh operation, assume that a single memory section to which is applied the above conventional refresh operation has 512 wordlines, then the ISO signal is re-energized 512 times during a refresh cycle. This also occurs for each additional memory section. Thus, if the memory has two such memory sections, then wordlines are re-energized 1,024(512*2). If the memory has N such memory sections, then wordlines are re-energized N*512 times.

In another example, a memory device having 256 Meg's of memory is typically divided into four equal banks of 64 Meg's. Each bank includes 32 sections of 2 Meg's each. Each section has 512 wordlines. Thus, each bank has 16 k wordlines, for a total of 64 k wordlines. One type of refresh operation is an 8 k refresh, which simultaneously refreshes two wordlines, one in one section and one in another section, in each of the four memory banks. That is, eight wordlines are simultaneously energized. In this type of refresh, the ISO signals will turn on 8,192 times and off 8,192 times {(2 ISO's*8 simultaneous wordlines)*512[section size]} per bank, in which two wordlines are energized at a time. Thus, conventional refresh schemes use a significant amount of energy, which is a premium in portable electronic devices powered by portable energy sources, e.g. batteries, to insure the integrity of the data stored in memory.

FIG. 5 shows a timing diagram of a refresh operation according to the present invention. The LEQ and ISO signals begin in an energized ("on") state. The LEQ and ISO signals are non-energized ("low" or grounded) and the first wordline $WL_0$ is energized to refresh the memory cells connected to it. After a time period sufficient to energize the memory cells having an energized or "on" state, the wordline $WL_0$ is de-energized (grounded). At about the same time as wordline $WL_0$ is grounded, LEQ is energized ("high" or Vcc). A counter in refresh circuit 120 increases by one to track which is the next wordline in the refresh cycle. Unlike the conventional refresh schemes, the circuit 310 holds ISO signal at its low state as explained in detail with regard to FIG. 3. Accordingly, energy is not drawn from the power source 150 (battery in portable devices) to re-energize the ISO signal. When refreshing the memory cells connected to the next wordline $WL_1$, only the LEQ signal is de-energized (grounded) because the ISO signal remains at the de-energized (grounded) state. This continues for each of n wordlines $WL_0$–$WL_{n-1}$. The counter updates its count after each wordline is energized. After the last wordline $WL_{n-1}$ is refreshed, then the ISO signal is re-energized (high or Vccp) again controlled by circuit 310.

As FIGS. 4 and 5 show, the ISO signal and wordlines WL0–WLn-1 are energized to a Vccp level. The LEQ signal is energized to a Vcc level. The Vccp is higher than Vcc. Thus, the energy saved according to the teachings of the present invention are based on a greater voltage level than the external voltage level Vcc. This results in greater power savings as the transition between ground and Vccp is greater than the transition between ground and Vcc. Therefore, it is important to reduce the number of re-energization of any signal to the Vccp level to conserve power.

FIG. 2 shows two memory sections 201 and 202. In one embodiment of the invention, at least one memory section is refreshed at a time. Memory section 202 is active and a read or write function is being performed. At the same time, memory section 201 is non-active and is not performing a read or write function. Odd memory section 201, at select times typically determined by memory controller 110, is subject to a refresh operation. The refresh of memory section 201 begins when appropriate latch reset path signal 320, enabling signal 330, and address signal 340 are received in latch 315. Based on these signals latch 315 will de-energize ISOa signal transmitted through line 231. LEQa signal traveling through line 221 to equilibration circuits 223 is de-energized. The first wordline $WL_0$ of memory section 201 is energized and the memory cells connected to wordline $WL_0$ are refreshed. Wordline $WL_0$ is de-energized and LEQa is energized. ISOa remains de-energized. The process, LEQa de-energization, wordline energization, wordline de-energization, LEQ energization, repeats itself for each wordline in memory section 201 until a refresh ending event occurs, which arrives as at least one of signals 320, 330, or 340 at latch 315. The refresh end events include refreshing the last wordline $WL_{n-1}$ in memory section 201, a normal activation of the ISOa signal, a skip in memory sequence to a different memory section (redundancy), and an access operation addressing the memory section 201. After a refresh end event occurs, the refresh operation on memory section 201 ends and ISOa is re-energized.

In another embodiment, two adjacent memory sections 201 and 202 could simultaneously undergo refresh operations. For example, in a configuration where the memory sections have separate sense amplifiers. That is, the sense amplifier banks of FIG. 2 each include separate sense amplifiers for each of the memory sections 201 and 202. The refresh operation on each of the memory sections is the same as the operation described above for each of the memory sections.

The refresh operation according to the invention does not require re-energization of the ISO signal in a section of memory undergoing a refresh operation after each wordline is energized and de-energized. The refresh operation automatically sequentially progresses ($WL_0$, $WL_1$, $WL_2$, . . . , $WL_{n-1}$) through a section of memory (e.g. 201) to refresh the memory cells therein while the ISO signal remains de-energized. The next location and operation in this section of memory is known and there is no need to re-energize the ISO signal. The present invention uses signals present in the memory device to re-energize the ISO signal when it is required to end the refresh cycle. More specifically, the latch reset path 320 senses when a refresh operation in a section is ended and the ISO latch circuit 315 re-energizes the ISO signal. The enabling signal 330 and the addressing signal 340 are also input into the ISO latch circuit 315 and based on these inputs, latch circuit 315 may re-energize the ISO signal.

The refresh operation according to the present invention is applicable to a memory section having a section size of any number of wordlines (e.g.64, 128, 256, 512, or greater). Even with any number of wordlines in a memory section, the ISO signal is re-energized only once at the end of a refresh operation for the memory section. When compared to the above conventional refresh of a memory section having 512 wordlines, the present invention reduces energy consumption at about a ratio of 1:512 per section (sub-array). In a memory device having 256 Meg of memory with four banks of 32 sections and an 8 k refresh, the ISO signals will turn on 16 times and off 16 times {2 ISO's*8 simultaneous wordlines)*1[section=any size]}. This represents a significant energy savings, especially in portable electronic devices.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art. A brief description of various embodiments of structures, devices and systems in which the present invention may be incorporated follows. It will be recognized that the following are exemplary and are not exclusive of other structures, devices, and systems in which the memory device according to present invention may be used.

Semiconductor Dies

Figure 6:
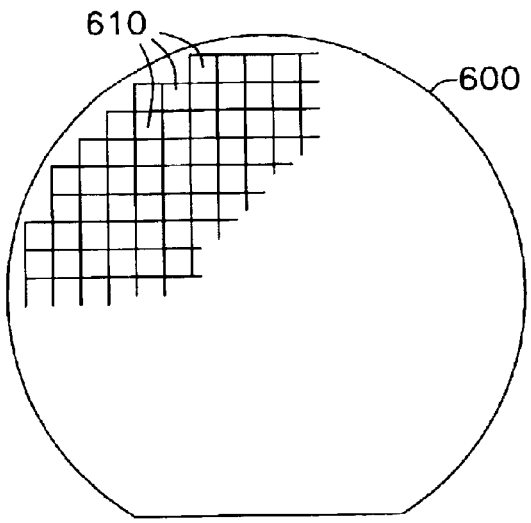
FIG. 6 is a view of a wafer containing semiconductor dies.

With reference to FIG. 6, for one embodiment, a semiconductor die 610 is produced from a wafer 600. A die is an individual pattern, typically rectangular, on a substrate that contains circuitry, or integrated circuit devices, to perform a specific function. At least one of the integrated circuit devices contains a memory with a refresh circuit in accordance with the present description. A semiconductor wafer will typically contain a repeated pattern of such dies containing the same functionality. Die 610 may contain circuitry for the memory device as discussed herein. Die 610 may further contain additional circuitry to extend to such complex devices as a monolithic processor with multiple functionalities. Die 610 is typically packaged in a protective casing (not shown) with leads extending therefrom (not shown) providing access to the circuitry of the die for unilateral or bilateral communication and control.

Circuit Modules

Figure 7:
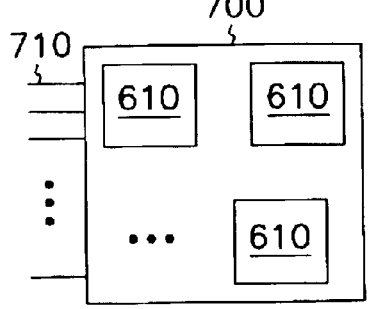
FIG. 7 is a block diagram of a circuit module.

As shown in FIG. 7, two or more dies 610 may be combined, with or without protective casing, into a circuit module 700 to enhance or extend the functionality of an individual die 610. Circuit module 700 may be a combination of dies 610 representing a variety of functions, or a combination of dies 610 containing the same functionality. One or more dies 610 of circuit module 700 contain at least one memory capable of a refresh operation as described herein.

Some examples of a circuit module include memory modules, device drivers, power modules, communication modems, processor modules and application-specific modules, and may include multilayer, multichip modules. Circuit module 700 may be a subcomponent of a variety of electronic systems, such as a clock, a television, a cell phone, a personal computer, an automobile, an industrial control system, an aircraft and others. Circuit module 700 will have a variety of leads 710 extending therefrom and coupled to the dies 610 providing unilateral or bilateral communication and control.

Figure 8:
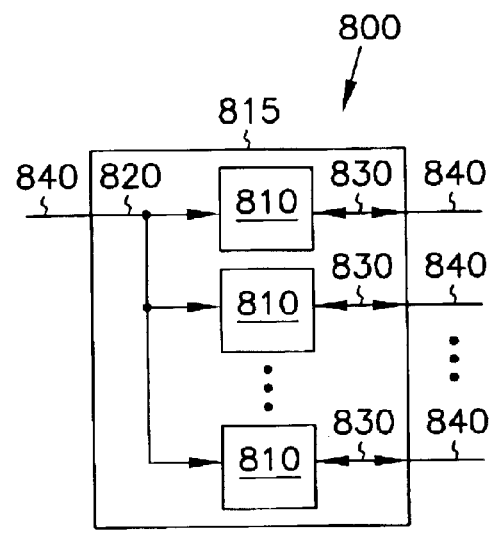
FIG. 8 is a block diagram of a memory module.

FIG. 8 shows one embodiment of a circuit module as memory module 800. Memory module 800 contains multiple memory devices 810 contained on support 815, the number generally depending upon the desired bus width and the desire for parity. Memory devices 810 include at least one memory capable of a refresh operation as described herein. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions shown in FIG. 8.

Electronic Systems

Figure 9:
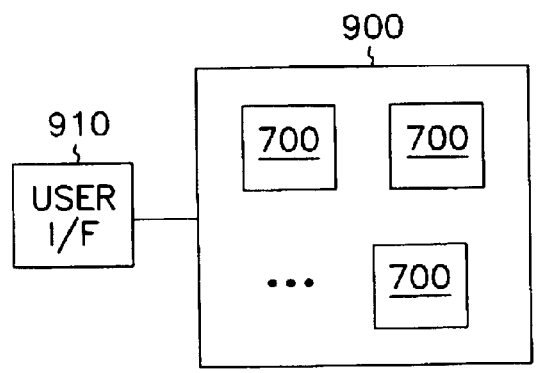
FIG. 9 is a block diagram of an electronic system.

FIG. 9 shows one embodiment of an electronic system 900 containing one or more circuit modules 700, at least one of which includes a memory device capable of a refresh operation as described herein. Electronic system 900 generally contains a user interface 910. User interface 910 provides a user of the electronic system 900 with some form of control or observation of the results of the electronic system 900. Some examples of user interface 910 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 910 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 910, or of other information either preprogrammed into, or otherwise provided to, electronic system 900. As will be apparent from the lists of examples previously given, electronic system 900 will often be associated with certain mechanical components (not shown) in addition to circuit modules 700 and user interface 910. It will be appreciated that the one or more circuit modules 700 in electronic system 900 can be replaced by a single integrated circuit. Furthermore, electronic system 900 may be a subcomponent of a larger electronic system.

Figure 10:
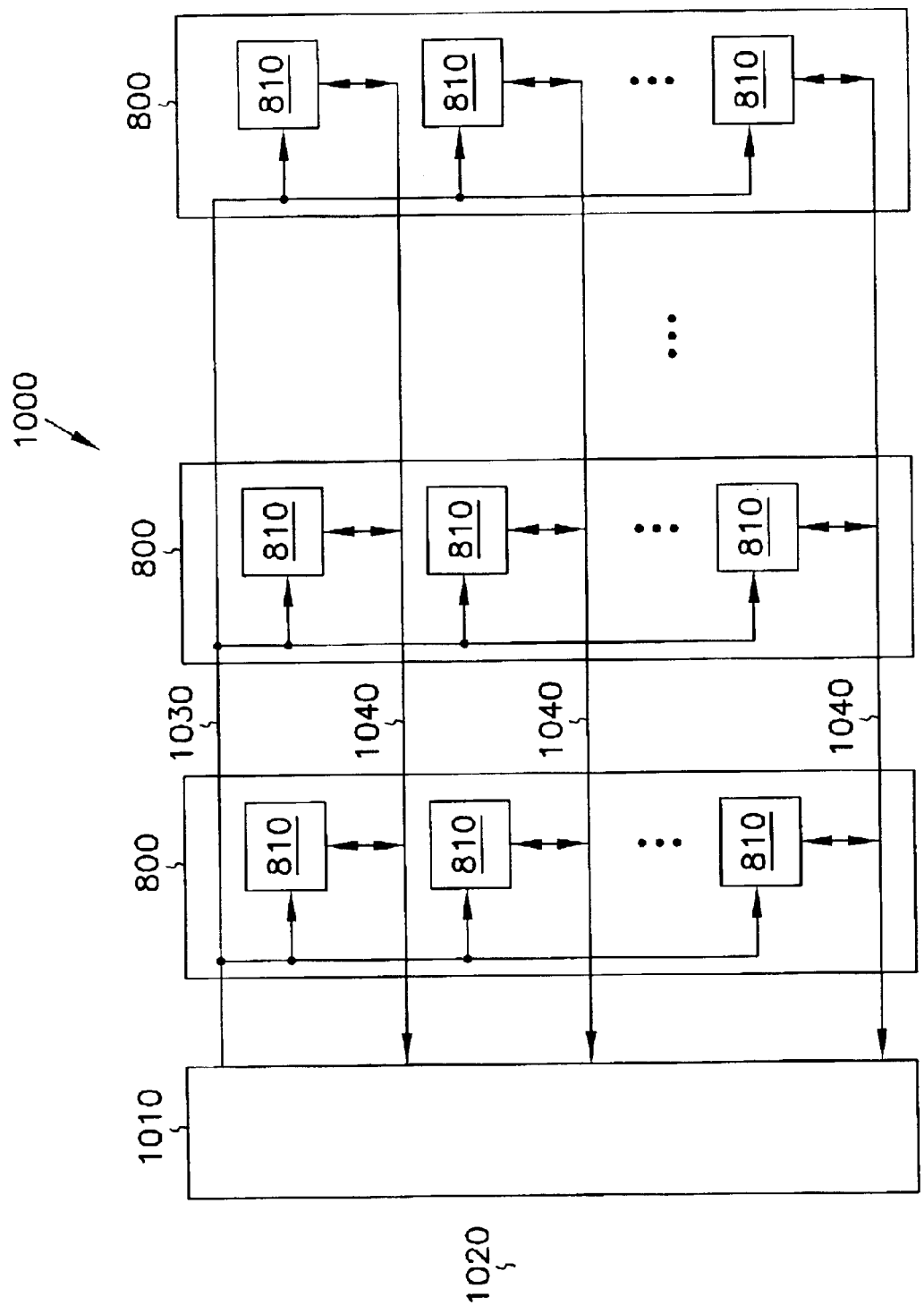
FIG. 10 is a block diagram of a memory system.

FIG. 10 shows one embodiment of an electronic system as memory system 1000. Memory system 1000 contains one or more memory modules 800 and a memory controller 1010. At least one of the memory modules is capable of a refresh operation as described herein. Memory controller 1010 provides and controls a bidirectional interface between memory system 1000 and an external system bus 1020. Memory system 1000 accepts a command signal from the external bus 1020 and relays it to the one or more memory modules 800 on a command link 1030. Memory system 1000 provides for data input and data output between the one or more memory modules 800 and external system bus 1020 on data links 1040.

Figure 11:
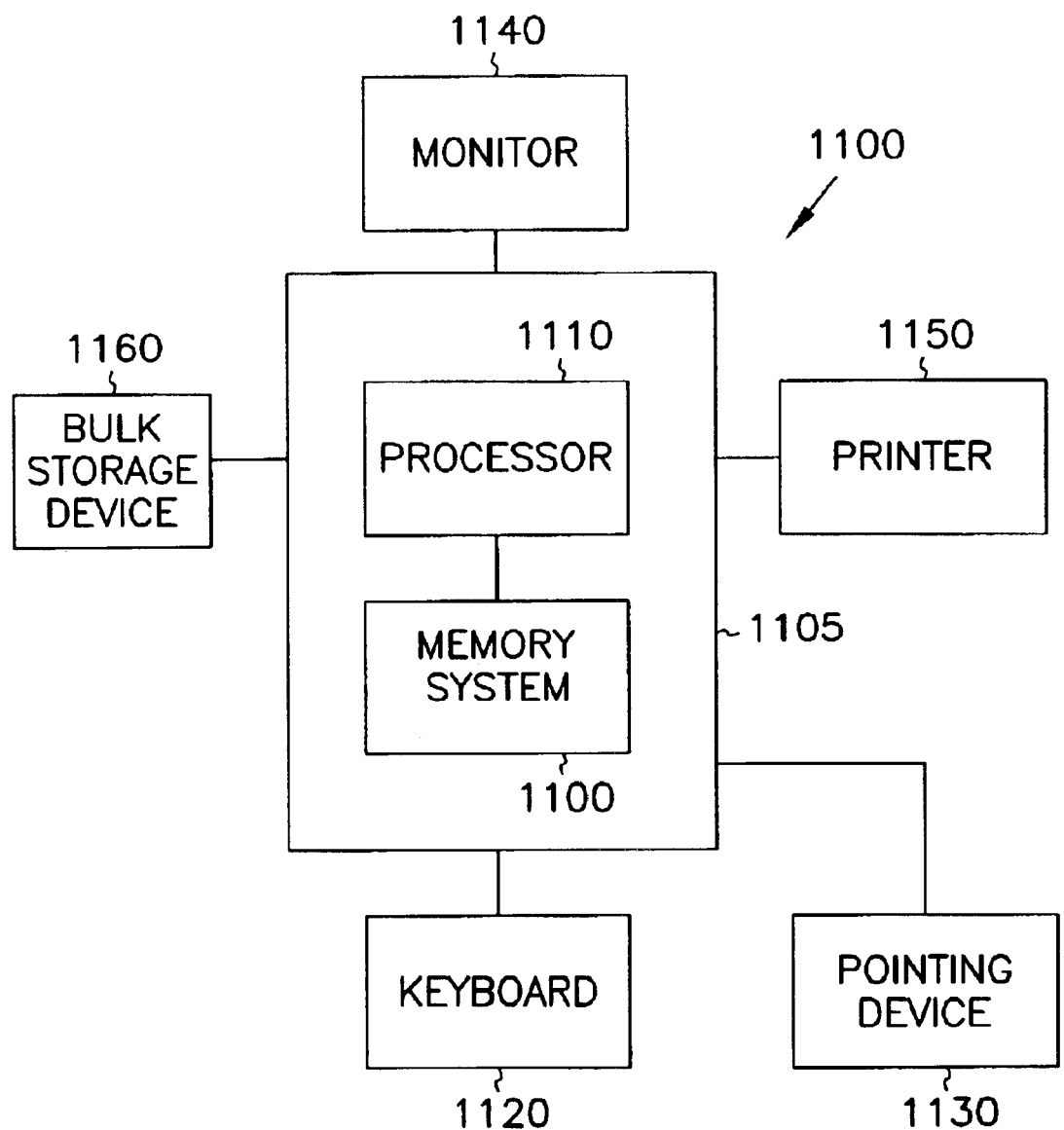
FIG. 11 is a block diagram of a computer system.

FIG. 11 shows a further embodiment of an electronic system as a computer system 1100. Computer system 1100 contains a processor 1110 and a memory system 1000 housed in a computer unit 1105. Computer system 1100 is but one example of an electronic system containing another electronic system, i.e., memory system 1000, as a subcomponent. The memory system includes at least one memory device that is capable of a refresh operation as described herein. Computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with computer system 1100 such as modems, device driver cards, additional storage devices, etc. It will further be appreciated that the processor 1110 and memory system 1000 of computer system 1100 can be incorporated on a single integrated circuit. Such single package processing units reduce the communication time between the processor and the memory circuit.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit which requires a refresh cycle and includes similar architecture as described herein.

It will be further understood that while the above description describes signals as being "on" when in the "high" or "powered" state, it is within the scope of the present invention to provide other signal states for "on". One example is a low-active signal, for example like RAS*. Suitable changes to the circuitry described herein would allow the present invention to be practiced with low or high active signals without departing from the scope of the present invention.

CONCLUSION

The present invention reduces the power consumed by a memory device in re-energizing the isolation signal during every cycle in a refresh operation. The isolation signal must be energized after each wordline is refreshed in conventional control schemes as it is not known whether a wordline in an associated memory array section will be addressed or not. In the present invention, the isolation signal control circuit holds isolation signal in an off state until an end event occurs while the refresh operation progresses though the memory array section. According to the teachings of the present invention the end events include, but is not limited to, reaching the end of the memory array section, receiving a self refresh exit signal, activating memory section access, and issuing a redundancy command. That is, the present invention is programmed to perform a refresh operation as the next operation in a memory section undergoing memory refresh until the refresh control circuit receives a command signal stopping the refresh operation. Thereafter, the refresh control circuit shifts the isolation signal to an energized state.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. A memory refresh method, comprising:
   isolating a memory array from a plurality of sense amplifiers by turning off a plurality of isolation circuits;
   energizing wordlines in the memory device to refresh memory cells in the memory array;
   maintaining the isolation of memory array until the memory cells connected to the wordlines are refreshed or until an end event occurs; and
   turning the plurality of isolation circuits on after the memory cells connected to the wordlines are refreshed.

2. The method of claim 1, further comprising shifting an LEQ signal from a non-energized state to an energized state between energizing successive wordlines.

3. The method of claim 1, wherein turning the plurality of isolation circuits includes energizing the isolation signal to a positive potential.

4. A memory refresh method, comprising:
   shifting an isolation signal from an energized state to a non-energized state;
   energizing wordlines in a memory array to refresh memory cells connected to the energized wordline; and
   holding the isolation signal in a non-energized state while energizing at least two wordlines.

5. The method of claim 4, further comprising shifting an LEQ signal from an energized state to a non-energized state.

6. The method of claim 5, wherein shifting the LEQ includes shifting the LEQ signal from the non-energized state to the energized state between energizing successive wordlines.

7. The method of claim 4, wherein holding the isolation signal includes re-energizing the isolation signal after energizing the last wordline.

8. A memory refresh method, comprising:
   shifting isolation devices for a sub-array of a memory device to a non-conducting state;
   energizing wordlines in the sub-array to refresh memory cells connected to the energized wordline; and
   holding the isolation devices in the non-conducting state during energizing wordlines and until an end event occurs.

9. The method of claim 8, wherein holding the isolation devices in the non-conducting state includes shifting the isolation device to a conducting state when a self-refresh exit signal is generated.

10. The method of claim 9, wherein holding the isolation devices in a non-conducting state includes shifting the isolation devices to a conducting state when an address signal indicates that at least one of the memory cells in the memory device is to be accessed.

11. The method of claim 10, wherein shifting the isolation devices to a conducting state includes reading data from the at least one memory cell.

12. The method of claim 9, wherein shifting the isolation devices to a conducting state includes writing data to the at least one memory cell.

13. The method of claim 9, wherein shifting the isolation devices to a conducting state includes shifting the isolation device to the conducting state when a redundancy signal indicates that a memory addressing sequence in the DRAM jumps to another memory array.

14. The method of claim 9, wherein holding the isolation devices in the non-conducting state includes turning on the isolation device when all of the wordlines in the memory device have been energized.

15. A memory method, comprising:
   selecting at least one of a plurality of memory arrays in the memory module on which to perform a refresh operation;
   isolating the at least one memory array from sense amplifier bank, in response to a non-energized isolation signal;
   energizing wordlines in the at least one memory array to refresh memory cells connected to the energized wordline; and
   maintaining isolation of the at least one memory array while a plurality of wordlines are energized and until an end event occurs.

16. The method of claim 15, wherein selecting the at least one of the plurality of memory arrays includes keeping a second of the plurality of memory arrays in electrical communication with the sense amplifier bank.

17. The method to claim 15, wherein keeping the second memory array includes performing at least one of reading and writing data to memory cells in the second memory array.

18. A method of reducing energy consumption during a memory refresh operation, comprising:
   holding two isolation circuits, which connect two memory sections to a sense amplifier bank, in a non-conductive state; and energizing wordlines in the two memory sections to refresh memory cells connected to the energized wordline until an end event occurs.

19. The method of claim 18, wherein holding the isolation circuits in the non-conducting state occurs until the entire two memory sections are refreshed.

20. The method of claim 18, wherein holding the isolation circuits in the non-conducting state only happens once for each refresh operation.

21. A memory device, comprising:
at least one memory array, the memory array requiring a refresh operation to store charges in the memory array;
at least one digit line pair connected to the memory array;
first and second isolation gates connected to a first and a second of the digit line pair;
a sense amplifier connected to the isolation gates; and
an isolation signal driver connected to the isolation gates, the isolation signal driver produces a non-energized isolation signal during the refresh operation such that the first and second isolation gates electrically insolate the sense amplifier from the one memory array for the duration of the refresh operation.

22. The memory device of claim 21, wherein the isolation signal driver includes a latch receiving a latch reset signal and an address signal, the isolation signal driver producing a non-energized isolation signal until at least one of the latch reset signal and the address signal are on.

23. The memory device of claim 22, wherein the latch reset signal being on indicates an end of the refresh operation in the at least one memory array.

24. The memory device of claim 23 wherein the end of the refresh operation indicates that the refresh operation in the at least one memory array is complete.

25. The memory device of claim 23, wherein the isolation signal driver issues a refresh exit signal after all of the wordlines have been sequentially energized.

26. The memory device of claim 22, wherein the address signal being on indicates a memory cell in the memory array is being accessed by an input/output device.

27. A memory device, comprising:
at least a first memory array and a second memory array;
a sense amplifier bank;
a plurality of digit line pairs connecting the first memory array and the second memory array to the sense amplifier bank;
a first plurality of isolation gate pairs connected to the plurality of digit line pairs intermediate the sense amplifier bank and the first memory array;
a second plurality of isolation gate pairs connected to the plurality of digit line pairs intermediate the sense amplifier bank and the second memory array; and
a first refresh circuit connected to the first plurality of isolation gate pairs and the first memory array, the first refresh circuit having a first state and a second state, wherein the first refresh circuit in the first state holds the first plurality of isolation gate pairs in a non-conductive state and refreshes charges stored in the first memory array until an end event occurs, in the second state the refresh circuit allows the first plurality of isolation gate pairs to fluctuate between conductive and non-conductive states as required to electrically connect and disconnected the plurality of digit line pairs to the sense amplifier bank.

28. The memory device of claim 27, wherein the refresh circuit includes a latch, the latch receiving a plurality of signals and based on a change of state of the signals moves the refresh circuit to the second state.

29. The memory device of claim 28, wherein the plurality of signals includes a self-refresh exit signal, a memory array activation signal, a redundancy signal.

30. The memory device of claim 27, wherein the first memory array and the second memory array are part of a DRAM.

31. The memory device of claim 27, wherein the refresh circuit is adapted to hold the first plurality of isolation gate pairs in the non-conductive state throughout an entire refresh cycle of the first memory array.

32. A memory device, comprising:
at least a first memory array and a second memory array;
a sense amplifier bank;
a plurality of digit line pairs connecting the first memory array and the second memory array to the sense amplifier bank;
a first plurality of isolation gate pairs connected to the plurality of digit line pairs intermediate the sense amplifier bank and the first memory array;
a second plurality of isolation gate pairs connected to the plurality of digit line pairs intermediate the sense amplifier bank and the second memory array;
a first refresh circuit connected to the first plurality of isolation gate pairs and the first memory array, the first refresh circuit having a first state and a second state, wherein the first refresh circuit in the first state holds the first plurality of isolation gate pairs in a non-conductive state and refreshes charges stored in the first memory array, in the second state the refresh circuit allows the first plurality of isolation gate pairs to fluctuate between conductive and non-conductive states as required to electrically connect and disconnected the plurality of digit line pairs to the sense amplifier bank; and
a second refresh circuit connected to the second plurality of isolation gate pairs and the second memory array, the second refresh circuit having a first state and a second state, wherein the second refresh circuit in the first state holds the second plurality of isolation gate pairs in a non-conductive state and refreshes charges stored in the second memory array, in the second state the refresh circuit allows the second plurality of isolation gate pairs to fluctuate between conductive and non-conductive states as required to electrically connect and disconnected the plurality of digit line pairs to the sense amplifier bank.

* * * * *